United States Patent [19]

Shichijo et al.

[11] Patent Number: 5,238,869
[45] Date of Patent: Aug. 24, 1993

[54] METHOD OF FORMING AN EPITAXIAL LAYER ON A HETEROINTERFACE

[75] Inventors: Hisashi Shichijo, Garland; Richard J. Matyi, Richardson, both of Tex.

[73] Assignee: Texas Instruments Incorporated, Dallas, Tex.

[21] Appl. No.: 918,777

[22] Filed: Jul. 27, 1992

Related U.S. Application Data

[63] Continuation of Ser. No. 224,428, Jul. 25, 1988, abandoned.

[51] Int. Cl.$^5$ ............... H01L 21/20; H01L 21/306; H01L 21/326
[52] U.S. Cl. .................... 437/126; 437/976; 437/132
[58] Field of Search .................... 437/976, 126

[56] References Cited

U.S. PATENT DOCUMENTS 4,561,916 12/1985 Akiyama et al. ............. 437/132
4,707,216 11/1987 Morkoc et al. ............. 156/610

OTHER PUBLICATIONS

Soga et al., "Selective MOCVD of GaAs on Si . . .," Jpn. J. App. Phys., vol. 26, No. 2, Feb. 1987, pp. 252–255.
Lee et al., "Ion . . . Molecular-Beam Epitaxy Grown GaAs-On-Si," J. Vac. Sci. Technol. B 5(3), May/Jun. 1987, pp. 827–830.
Koch et al., "The Growth of GaAs o n Si by Molecular Beam Epitaxy," Mat. Sec. Soc. Symp. Proc., vol. 67, 1986, pp. 37–43.
Chand et al., ". . . Molecular Beam Epitaxially Grown GaAs on Si (100) by Rapid Thermal Annealing," Appl. Phys. Lett., 49(13), 29 Sep. 1986, pp. 815–817.
Choi et al., "Monolithic Integration of Si and GaAs Devices," Mat. Res. Soc. Symp. Proc., vol. 67, 1986, pp. 165–171.
Lee et al., ". . . Selective-Area Molecular Beam Epitaxy of GaAs Film on Si Substrate," Appl. Phys. Lett., 52(3), 18 Jan. 1988, pp. 215–217.
Tsaur et al., "Molecular Beam Epitaxy of GaAs and AlGaAs on Si," Appl. Phys. Lett., 45(5), 1 Sep. 1984, pp. 535–536.
Akiyama et al., "Growth of High Quality GaAs Layers on Si Substrates by MOCVD," J. Crys. Growth, 77 (1986), pp. 490–497.
Mizuguchi et al., "MOCVD GaAs Growth on Ge (100) and Si (100) Substrates," J. Crys. Growth, 77 (1986), pp. 509–514.
Fischer et al., "Monolithic Integration of GaAs/AlGaAs . . . Silicon Circuits," Appl. Phys. Lett. 47(9), 1 Nov. 1985, pp. 983–985.
Turner et al., "High Speed Photoconductive Detectors Fabricated in Heteroepitaxial GaAs Layers," Mat. Res. Soc. Symp. Proc., vol. 67, 1986, pp. 181–188.

Primary Examiner—Olik Chaudhuri
Assistant Examiner—Ramamohan R. Paladugu
Attorney, Agent, or Firm—Richard A. Stoltz; James C. Kesterson; Richard L. Donaldson

[57] ABSTRACT

Heteroepitaxy of lattice-mismatched semiconductor materials such as GaAs (110) on silicon (102) is accomplished by formation of a defect annihilating grid (104) on the silicon (102) prior to the epitaxy of the GaAs (110).

12 Claims, 3 Drawing Sheets

METHOD OF FORMING AN EPITAXIAL LAYER ON A HETEROINTERFACE

This application is a continuation of application Ser. No. 224,428 filed Jul. 25, 1988, now abandoned.

CROSS-REFERENCE TO RELATED APPLICATIONS

Copending U.S. application Ser. No. 912,028, filed Sep. 26, 1986 (J. W. Lee), now abandoned and U.S. Pat. No. 4,914,053 (Matyi and Shichijo), disclose related subject matter. These cross-referenced application and patent are assigned to the assignee of the present application.

BACKGROUND OF THE INVENTION

1. Field of the Invention

The present invention relates to growth of semiconductor materials and devices, and, more particularly, to heteroepitaxial growth such as gallium arsenide on silicon and devices in such heterostructures.

2. Description of the Related Art

The growth of high quality gallium arsenide (GaAs) or other III-V compound semiconductors on silicon substrates is recognized as a desirable goal for the fabrication of advanced semiconductor devices. Specific advantages of this combination of materials include the availability of GaAs with high electron mobility and optical activity on a silicon substrate with improved mechanical strength and thermal conductivity over that obtainable with GaAs substrates. In addition, the growth of high quality GaAs on silicon offers the possibility of monolithically integrating GaAs and silicon devices for advanced electronic components. A number of workers have previously described advanced GaAs devices fabricated on silicon substrates as well as the successful cointegration of silicon and GaAs devices.

One of the key limitations in the implementation of device structures based on heteroepitaxial GaAs on silicon has been the 4.1% difference in lattice parameters between the two materials. This lattice mismatch leads to the formation of a network of misfit dislocations at the heterointerface; under typical epitaxial growth conditions, a significant fraction of these misfit defects thread away from the interface and into the GaAs regions where devices are subsequently fabricated. It is the presence of these threading dislocations (which can serve as recombination and scattering centers) that has seriously limited the implementation of GaAs on silicon technology.

A number of schemes have been reported for either annihiliating or retarding the propagation of threading dislocations in lattice mismatched semiconductors such as GaAs on silicon. Notably among these is post-growth thermal annealing for defect reduction; see J. W. Lee et al, 50 Appl. Phys. Lett. 31 (1987), Choi et al, 50 Appl. Phys. Lett. 992 (1987). Post-growth annealing by itself has been shown to be effective at reducing the global defect in GaAs layers on silicon substrates; however, there is insufficient data at this time to determine its effectivenes at lowering the density of device degrading threading dislocations. Similarly, Fan et al., U.S. Pat. No. 4,632,712, interrupts the GaAs growth to trap threading dislocations. Alternatively, a number of workers have studied the use of either compositional or thermally cycled superlattices during the growth process for dislocation control; see J. W. Lee, Proc. 1986 Int'l. Symp. on GaAs and Related Compounds 111 (1987), T. Soga et al, 26 Japan. J. Appl. Phys. L536 (1987), R. D. Dupuis et al, 50 Appl. Phys. Lett. 407 (1987). It appears from this literature that the primary effect of an intermediary superlattice is to deflect the threading dislocations by the imposition of a strain field (either by thermal effects in the case of the thermally cycled layer or by lattice dilations in the case of chemical superlattices) in such a way that they tend to propagate parallel instead of obliquely to the heterointerface. See Szilagyi et al, 4 J. Vac. Sci. Tech. A 2200 (1986). FIG. 1 illustrates in schematic cross sectional elevation view a threading dislocation that originates at point A at the heterointerface and propagates to point B in the superlattice, follows the superlattice to point C, and then continues propagation through the GaAs to surface point D. If the dislocation is annihilated in the superlattice or if it propagates long distances in the superlattice (distance from point B to point C), then the dislocation is effectively kept away from devices formed at the surface. However, a significant fraction of dislocations appear to propagate no more than about 10 to 20 μm in the superlattice and eventually reach the surface.

Recent work has demonstrated that it is possible to selectively grow islands of GaAs epitaxially onto silicon substrates when the latter is patterned with a mask of material such as silicon dioxide or silicon nitride; the silicon is exposed through openings about 1 mm square. See Matyi et al, 51 Appl. Phys. Lett. 637 (1987), Matyi et al, 6 J.Vac.Sci.Tech.B 699 (1988). The effect of postgrowth annealing on the patterned epitaxial layer has been found to be dramatic; in addition to lowering the overall defect density, post growth annealing also has been observed to drive a solid state recrystallization of the polycrystalline GaAs that was originally grown on top of the patterning mask to extend the single crystal islands about 1 to 2 μm.

Also, growth of GaAs on silicon mesas has been demonstrated with smaller mesas yielding lower defect densities; see E. Fitzgerlad et al, 52 Appl.Phys.Lett. 1496 (1988).

However, the known methods still have unacceptably high threading dislocation densities for GaAs epitaxially grown on silicon.

SUMMARY OF THE INVENTION

The present invention provides heteroepitaxial substrates and devices fabricated thereon and methods of fabrication which include a dislocation absorbing grid at the heterointerface.

BRIEF DESCRIPTION OF THE DRAWINGS

The drawings are schematic for clarity.

DESCRIPTION OF THE PREFERRED EMBODIMENTS

Figure 2:
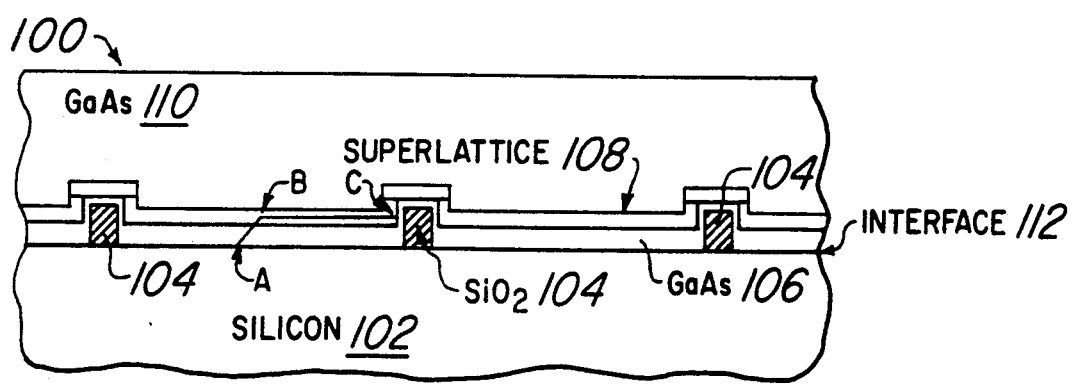
FIG. 2 is a cross sectional elevation view of a first preferred embodiment structure.
Figure 3:
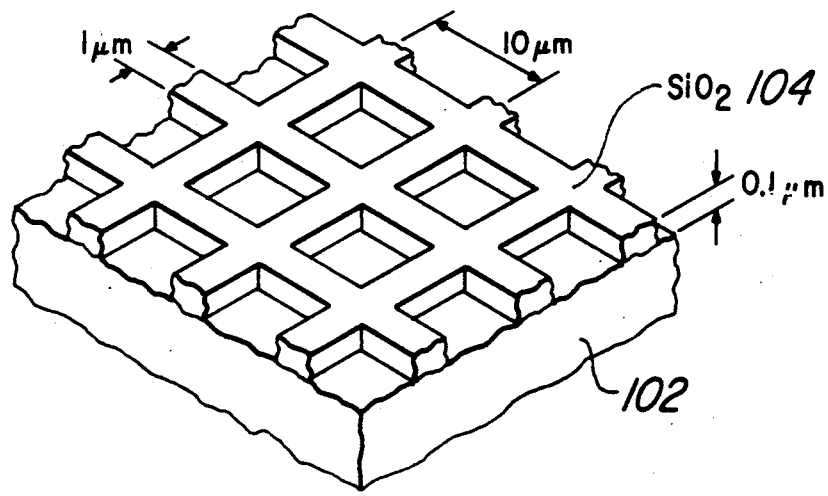
FIG. 3 is perspective view of a first preferred embodiment structure.
Figure 4A:
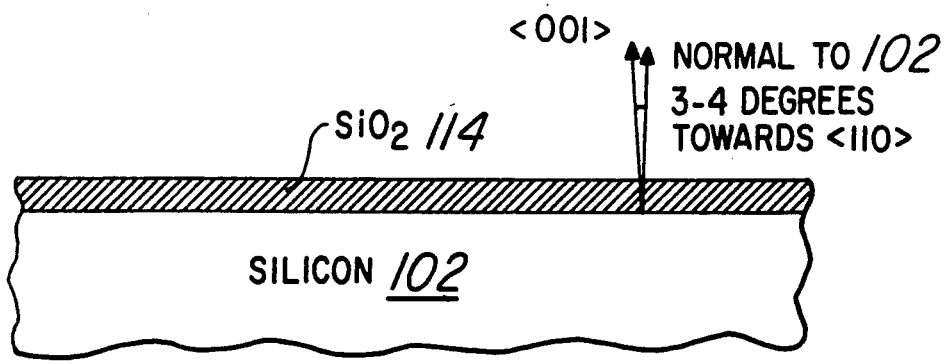
FIGS. 4a–e are cross section elevation views of steps of a first preferred embodiment method of fabrication.
Figure 4B:
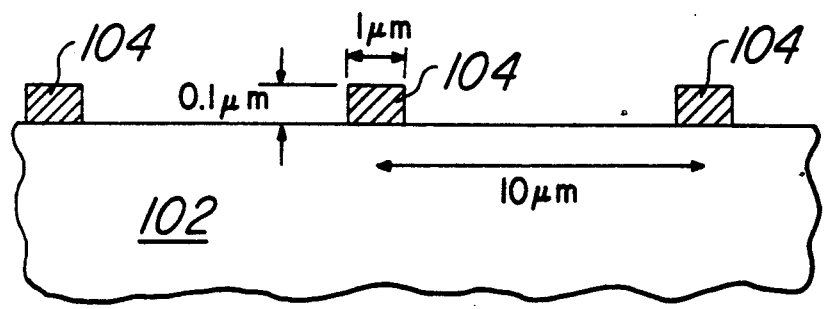
Figure 4C:
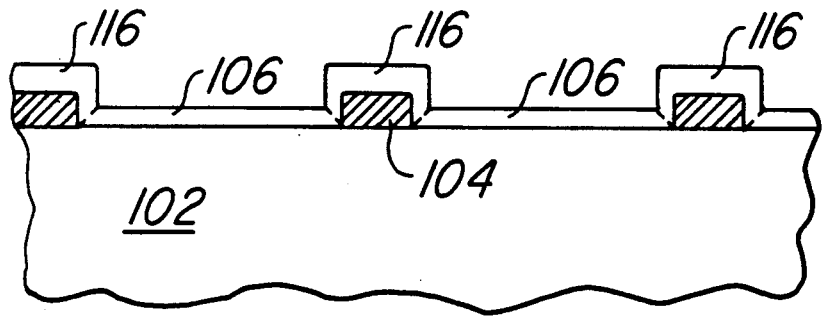
Figure 4D:
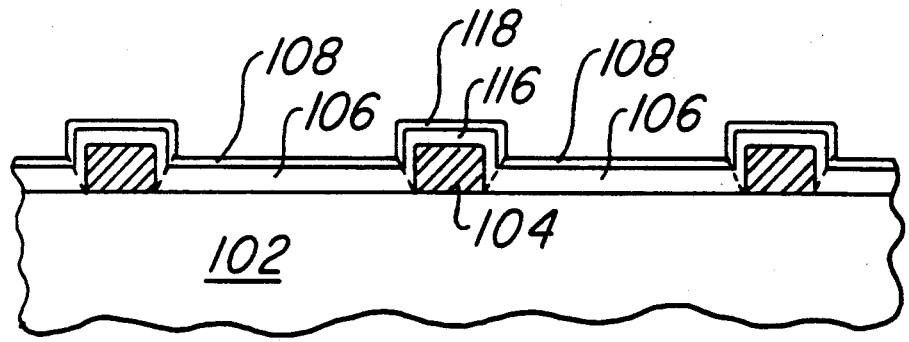
Figure 4E:
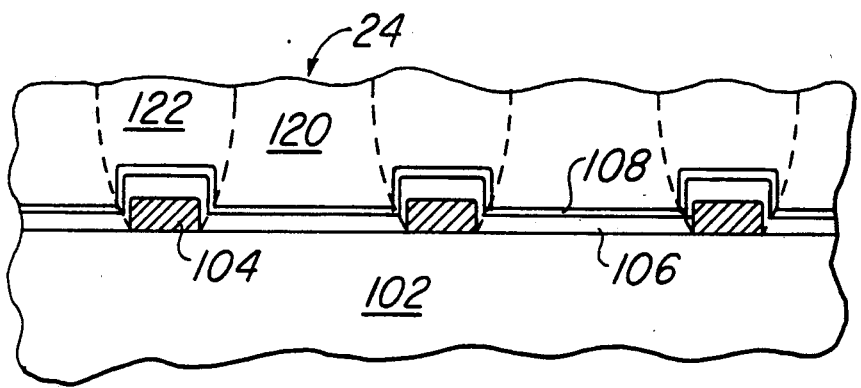

A first embodiment heteroepitaxial structure, shown in schematic cross sectional elevation view in FIG. 2 and generally denoted 100, includes silicon substrate 102, silicon dioxide grid 104, 500 Å thick GaAs buffer layer 106, short period superlattice 108 made of five alternating $Al_xGa_{1-x}As$ and GaAs layers of 50 Å thickness each, and GaAs layer 110 of thickness 2.0 microns. Active devices such as MESFETs and JFETs may be fabricated in GaAs layer 110, or layer 110 could be grown to include both GaAs and $Al_xGa_{1-x}As$ layers and heterojunction bipolar transistors fabricated in layer 110. FIG. 3 is a perspective view illustrating grid 104.

Figure 1:
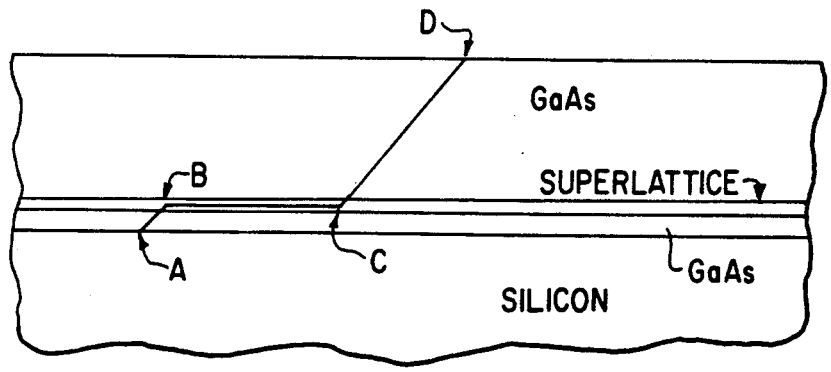
FIG. 1 is a cross sectional elevation view of a known dislocation reduction structure.

The performance of grid 104 is as follows. In the absence of grid 104, threading dislocations that are nucleated at the heterointerface between the growing epitaxial layer and the substrate are free to propagate parallel to the heterointerface prior to propagating along inclined glide planes away from the heterointerface into near surface or surface regions of the epitaxial layer where the fabrication of electronic devices will be performed subsequent to growth. In an attempt to retard this propagation of threading dislocations, superlattice layers consisting of either varying chemical composition or thermal strain due to temperature cycling during growth, or both, have been inserted during growth of the epitaxial layer and tend to deflect dislocations to propagate within the superlatice as illustrated by line A-B-C in FIG. 1. However, the dislocation may break from the superlattice and continue propagation along glide planes as illustrated by line C-D in FIG. 1.

In contrast, grid 104 in structure 100 will provide a "drain" for the dislocations as they propagate in superlattice 108 parallel to heterointerface 112. In this manner, most of the threading dislocations will terminate at grid 104 (line A-B-C in FIG. 2) instead of propagating into the surface region (line C-D in FIG. 1) where electronic devices will be fabricated.

The diameter of the openings of grid 104 are about 10 $\mu$m, which is less than the typical distance that a dislocation propagates in superlattice 108 (distance B-C in FIG. 2), and the elements of grid 104 are about 1 $\mu$m wide and about 0.1 $\mu$m high. The 1 $\mu$m width is small enough to insure that upon annealing, GaAs 110 becomes single crystal over grid 104.

The first preferred embodiment method of fabrication of the first preferred embodiment structure is illustrate in cross sectional elevation view in FIGS. 4a–e and includes the following steps:

(a) Approximately 0.1 micron of silicon dioxide 114 (or silicon nitride or a combination of silicon dioxide and silicon nitride) is either thermally grown or deposited by plasma deposition processes on a starting silicon substrate 102. Substrate is misoriented from the <001> direction by an amount of approximately 3 to 4 degrees towards the <110> direction in order to facilitate high quality epitaxial growth and insure a common orientation of all of the single crystal GaAs islands grown on substrate 102. See FIG. 4a.

(b) Oxide 114 is patterned and etched using conventional photolithographic techniques to form grid 104 of squares with square size of 10 $\mu$m and edge width of 1 $\mu$m and vertical sidewalls. Although the illustration in FIG. 3 shows the patterning mask in the form of a square grid 104 on top of substrate 102, it may also be embodied in grids with rectangular, hexagonal or other aperture shapes. See FIG. 4b.

(c) Conventional epitaxial growth technologies such as molecular beam epitaxy (MBE), metalorganic chemical vapor deposition (MOCVD), or other suitable semiconductor epitaxial vapor deposition techniques are used to grow GaAs layer 106 epitaxially onto the regions of silicon substrate 102 exposed inside the squares of grid 104. This also grows polycrystalline GaAs 116 on top of and along the sidewalls of grid 104; see FIG. 4c. Note that with MBE growth the directionality of the impinging beams limits the thickness of polycrystalline GaAs 116 on the vertical sidewalls of grid 104. Layer 106 is grown to a thickness of 500 Å, about half way up the sidewalls of grid 104.

(d) A short period superlattice 108 is grown on GaAs 106 by MBE, MOCVD or other epitaxial deposition by first growing a 50 Å thick layer of $Al_xGa_{1-x}As$, next a 50 Å layer of GaAs, then another $Al_xGa_{1-x}As$ layer and another GaAs layer, and finally a last $Al_xGa_{1-x}As$ layer. Thus superlattice 108 is 250 Å thick. Note that the growth on polycrystalline GaAs 116 yields polycrystalline $Al_xGa_{1-x}As$ and GaAs superlattice 118. See FIG. 4d.

(e) Grow GaAs layer 120 by MBE, MOCVD, or other epitaxial deposition on superlattice 108 to a thickness of 2 $\mu$m; simultaneously polycrystalline GaAs 122 grows on polycrystalline superlattice 118. See FIG. 4e which is not to scale for clarity; in particular, polycrystalline portion 122 is about 2 $\mu$m wide at surface 124 whereas single crystal portion 120 is about 9 $\mu$m wide.

(f) Following epitaxial growth, the layered structure will be given a post-growth anneal in a furnace supplying an arsenic overpressure at a temperature of 850 C. for 15 minutes, or a rapid thermal anneal at 950 C. for several seconds, or other similar post-growth anneal designed for the reduction of the defect density in lattice mismatched heteroepitaxial systems. This anneal process will convert the polycrystalline or highly defective GaAs 122 and 116 and superlattice 118 grown on top of grid 104 into high quality single crystal compound semiconductor due to the lateral growth of the single crystal GaAs or $Al_xGa_{1-x}As$ from the neighboring regions 120, 106, and 108. In this manner, the entire epitaxial surface region will be converted to single crystal material as shown in FIG. 2. Because of the limited lateral growth during annealing, the width of grid 104 edges should be limited to about 2 microns. Also, the orientation of silicon substrate 102 insures that each region 120 of single crystal GaAs has the same orientation, so the anneal will not have to impose large scale crystal change.

Figure 5:
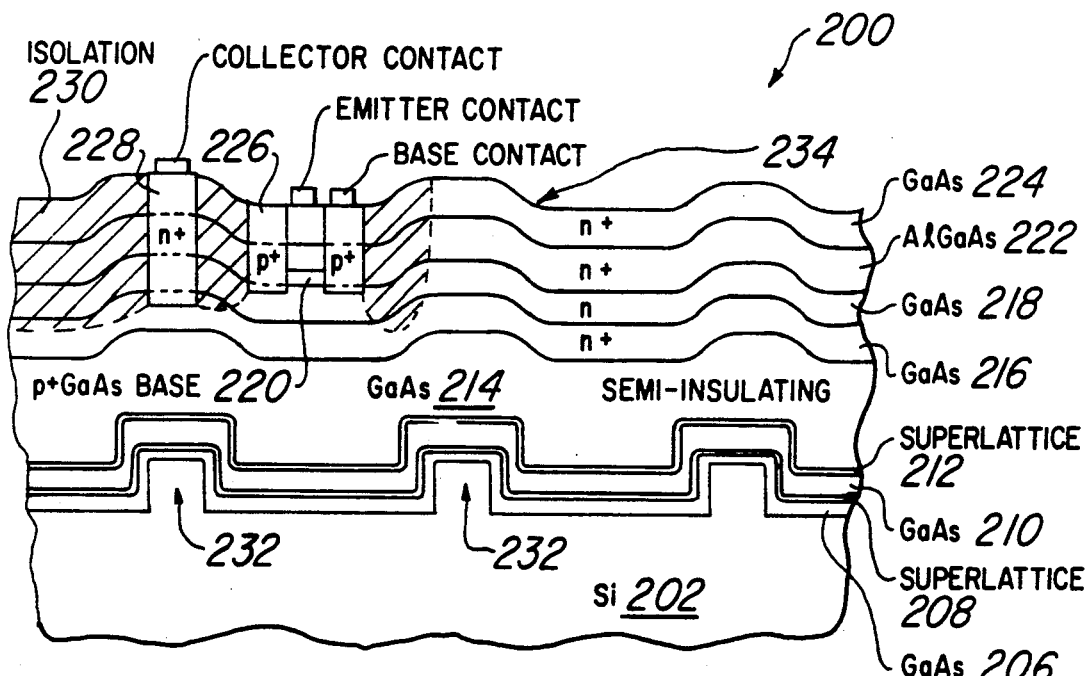
FIG. 5 is a cross sectional elevation view of a second preferred embodiment.

A second preferred embodiment, generally denoted 200, is shown in cross sectional elevation view in FIG. 5 and includes silicon substrate 202, 500 Å thick GaAs buffer layer 206, short period superlattice 208 made of $Al_xGa_{1-x}As$ and GaAs, second 500 Å thick GaAs buffer layer 210, second short period superlattice 212, 2 $\mu$m thick semi-insulating GaAs layer 214, 1 $\mu$m thick n+ GaAs layer 216, 0.5 $\mu$m thick n− GaAs collector layer 218, 0.1 $\mu$m thick p+ GaAs base region 200, 0.5 $\mu$m thick n+ $Al_xGa_{1-x}As$ layer 222 emitter layer which is grown over base region 220, 0.5 $\mu$m thick GaAs ohmic contact layer 224, p+ doped regions 226 for contact to base region 220, n+ doped region 228 for contact to the collector, and isolation regions 230 formed by boron implantation lattice damage. In this embodiment silicon substrate 202 has a grid 232 formed by recesses of approximately 0.2 micron using either planar wet etching or non-orientation specific dry etching techniques. The etching will be performed to produce a pattern similar to that of grid 104 in FIG. 3. Growth of the GaAs and superlattices is as with the first preferred embodiment, although in structure 200 more complicated layers have been grown in order to illustrate a heterojunction bipolar transistor. Note that the vertical scale in FIG. 5 has been exaggerated for clarity, and that substrate grid 232 will serve the identical purpose of interception of threading dislocations as described for the amorphous material grid 104 interface in the first preferred embodiment. Having two superlattices 208 and 212 increases the parallel propagation, and because grid 232 is single-crystal silicon the GaAs deposited over grid 232 will also be single crystal. Thus the anneal after growth of the GaAs and superlattices may be omitted. The undulations in surface 234 due to grid 232 are not larger than the height of grid 232 (0.2 $\mu$m) and are small enough to not disrupt the photolithography used to fabricate devices in structure 200.

MODIFICATIONS AND ADVANTAGES

Various modifications of the preferred embodiments may be made while retaining the feature of threading defect confinement in a heteroepitaxial layer grown on a substrate having a grid formed either by patterning a layer of material on the substrate or by etching recesses in the substrate. For example, various semiconductor epitaxial layers such as II-VI semiconductors may be used although the anneal times and temperatures may be drastically different, various grid materials such as oxide/nitride stacks or metal oxides such as tantalum oxide may be deposited or reacted with the substrate, the dimension and shape of the grid may be varied to accommodate the materials being used with larger grid openings for materials with longer parallel propagation of dislocations and even the superlattice may be omitted if parallel propagation within the buffer layer of the growing material is sufficiently long, the superlattice(s) may be thermally strained superlattice(s), various combinations of semiconductor epitaxial layer (GaAs, AlGaAs, CdTe, HgCdTe, InGaAs, InAlAs, and similar III-V and II-VI semiconductors typically grown from the vapor phase as epitaxial layers) and substrate (Si, Si-on-insulator, Ge, GaAs, CdTe and similar elemental, III-V, and II-VI semiconductors typically utilized as substrates for epitaxial growth) can be used with postgrowth anneal times and temperatures varying or even omitted with a substrate grid, even non-semiconductor materials can be used provided that the substrate has a lattice for inducing epitaxial growth, and various devices such as JFETs, MESFETs, and MOSFETs can be fabricated in the structures to form integrated circuits.

What is claimed is:

1. A method of forming an epitaxial layer on a heterointerface having a minimum of dislocations propagating to or near the outer surface of said epitaxial layer in the region wherein devices will be fabricated, comprising the steps of:
   a) providing a substrate having a heterointerface thereon whereat most dislocations are generated and propagate up to about 20 $\mu$m and a grid at said heterointerface for absorbing said dislocations, said grid composed of intersecting lines forming quadrilaterals, the distance between opposing sides of each quadrilateral being about 10 $\mu$m; and
   b) growing a semiconductor layer on said grid and said heterointerface, said growth characterized by single crystal regions on portions of said heterointerface.

2. The method of claim 1, comprising the further step of:
   a) annealing said semiconductor layer.

3. The method of claim 2, wherein:
   a) said substrate is silicon;
   b) said grid is made of material from the group consisting of silicon dioxide, silicon nitride, and combinations thereof; and
   c) said semiconductor layer is $Al_xGa_{1-x}As$ wherein $0 \leq x \leq 1.0$.

4. The method of claim 3 wherein said anneal is at a temperature of about 850° C. for about 15 minutes under an arsenic overpressure.

5. The method of claim 3, wherein said anneal is at a temperature of about 950° C. for about 10 seconds.

6. The method of claim 1 wherein said guadrilateral is substantially a rectangle.

7. A method of forming an epitaxial layer on a heterointerface having a minimum of dislocations propagating to or near the outer surface of said epitaxial layer in the region wherein devices will be fabricated, comprising the steps of:
   a) providing a semiconductor substrate having a heterointerface thereon whereat most dislocations are generated and propagate up to about 20 $\mu$m including a dislocation absorbing grid composed of intersecting and non-intersecting lines forming plural quadrilaterals at said heterointerface for absorbing said dislocations; and
   b) growing a continuous monocrystalline semiconductor layer extending over at least three adjacent non-intersecting lines of said grid and said surface.

8. The method of claim 7 wherein said quadrilateral is substantially a rectangle.

9. The method of claim 7 wherein the distance between opposing sides of each of said quadrilaterals is about 10 $\mu$m.

10. The method of claim 8 wherein the distance between opposing sides of each of said quadrilaterals is about 10 $\mu$m.

11. The method of claim 1 further including forming an active semiconductor device in said semiconductor layer which extends over said dislocation absorbing grid.

12. The method of claim 7 further including forming an active semiconductor device in said monocrystalline semiconductor layer which extends over said dislocation absorbing grid.

* * * * *